United States Patent
Mueller et al.

(10) Patent No.: US 11,713,965 B2
(45) Date of Patent: Aug. 1, 2023

(54) METHOD AND APPARATUS FOR DETERMINING A CHAMFER PROPERTY OF A WORKPIECE CHAMFER AND COMPUTER PROGRAM

(71) Applicant: Carl Zeiss Industrielle Messtechnik GmbH, Oberkochen (DE)

(72) Inventors: Heinrich Mueller, Gerstetten (DE); Konrad Werner, Oberkochen (DE)

(73) Assignee: Carl Zeiss Industrielle Messtechnik GmbH, Oberkochen (DE)

( * ) Notice: Subject to any disclaimer, the term of this patent is extended or adjusted under 35 U.S.C. 154(b) by 0 days.

(21) Appl. No.: 16/870,971

(22) Filed: May 10, 2020

(65) Prior Publication Data

US 2020/0355495 A1 Nov. 12, 2020

(30) Foreign Application Priority Data

May 10, 2019 (DE) ..................... 10 2019 206 797.2

(51) Int. Cl.
*G01B 21/22* (2006.01)
*G01B 21/02* (2006.01)
*G06F 30/10* (2020.01)

(52) U.S. Cl.
CPC ............. *G01B 21/22* (2013.01); *G01B 21/02* (2013.01); *G06F 30/10* (2020.01)

(58) Field of Classification Search
None
See application file for complete search history.

(56) References Cited

U.S. PATENT DOCUMENTS

| 5,091,861 | A | * | 2/1992 | Geller | ..................... | B23C 9/005 |
| | | | | | | 700/192 |
| 5,500,737 | A | * | 3/1996 | Donaldson | .............. | G06T 7/521 |
| | | | | | | 356/606 |
| 5,682,886 | A | * | 11/1997 | Delp | ..................... | A61B 90/36 |
| | | | | | | 600/407 |

(Continued)

FOREIGN PATENT DOCUMENTS

DE 1325269 A1 2/1995
DE 102007003891 A1 7/2008

(Continued)

OTHER PUBLICATIONS

Espacenet machine translation, Kubo Sadao et al., "Bevel Measurement System," JP2009075136A, Apr. 9, 2009 (Year: 2009).*

(Continued)

*Primary Examiner* — Eman A Alkafawi
*Assistant Examiner* — Denise R Karavias
(74) *Attorney, Agent, or Firm* — Ewers IP Law PLLC; Falk Ewers (57) ABSTRACT

An apparatus, a method, and a computer program for determining a chamfer property of a workpiece chamfer are provided. The method includes generating measurement points along at least a first measuring path, the first measuring path running over a first chamfer edge, determining at least one unadapted compensating element for the measurement points of the first measuring path, and determining a spatial position of the first chamfer edge depending on a deviation between the measurement points of the first measuring path and the at least one unadapted compensating element.

10 Claims, 4 Drawing Sheets

(56) References Cited

U.S. PATENT DOCUMENTS

| | | | | |
|---|---|---|---|---|
| 6,665,080 B1* | 12/2003 | Haertig | ............... | G05B 19/401 |
| | | | | 356/601 |
| 7,499,830 B2* | 3/2009 | Harding | ............... | G01B 11/255 |
| | | | | 702/167 |
| 2008/0077351 A1* | 3/2008 | Tischler | .............. | H01J 49/0036 |
| | | | | 702/128 |
| 2012/0209553 A1* | 8/2012 | Doytchinov | ......... | G01B 21/047 |
| | | | | 702/81 |
| 2013/0162806 A1* | 6/2013 | Ding | ................... | G01B 11/028 |
| | | | | 382/152 |

FOREIGN PATENT DOCUMENTS

| | | |
|---|---|---|
| DE | 102017110339 A1 | 11/2018 |
| WO | 2017121468 A1 | 7/2017 |

OTHER PUBLICATIONS

Lisa Huang et al., "How to draw the line in biomedical research," Mar. 19, 2013, NCBI, downloaded from https://www.ncbi.nlm.nih.gov/pmc/articles/PMC3601633/on Oct. 28, 2021 (Year: 2013).*

Ventura et al., "Strategies for grinding of chamfers in cutting Inserts," Precision Engineering, vol. 38, Issue 4, Oct. 2014, pp. 749-758, downloaded from https://www.sciencedirect.com/science/article/pii/S0141635914000749 on Oct. 13, 2022 (Year: 2014).*

\* cited by examiner

METHOD AND APPARATUS FOR DETERMINING A CHAMFER PROPERTY OF A WORKPIECE CHAMFER AND COMPUTER PROGRAM

CROSS REFERENCE TO RELATED APPLICATIONS

This application claims priority to German patent application DE 10 2019 206 797.2, filed May 10, 2019, the entire content of which is incorporated herein by reference.

TECHNICAL FIELD

The disclosure relates to a method and an apparatus for determining a chamfer property of a workpiece chamfer and to a computer program for determining a chamfer property of a workpiece chamfer. The disclosure further relates to an apparatus for data processing.

BACKGROUND

When measuring workpieces, for example as part of quality control, it may be necessary to determine properties of a chamfer of the workpiece. It may thus be possible for example that a test criterion is evaluated depending on the chamfer property. Consequently, the chamfer property may form a test parameter. Properties that may be mentioned by way of example are a spatial position of the chamfer, in particular in the coordinate system of the workpiece, a chamfer width and a chamfer angle.

In particular in the case of chamfers of small dimensions, measurement, that is to say the generation of measurement points and their evaluation, is problematic, because in the case of such chamfers only a small number of measurement points can be generated along the surface of the chamfer. It is also problematic that a positional tolerance of spatial positions of a chamfer edge may be greater than the actual chamfer width, which may likewise make measurement more difficult.

WO 2017/121468 A1 describes a method and an apparatus for specifying specification data for a measurement of a workpiece to be measured with a coordinate measuring machine, the document disclosing chamfers with specific chamfer angles as a property used for ascertaining test features. Furthermore, the document discloses the adaptation of envelope curves or envelope surfaces to measurement results.

SUMMARY

A technical problem addressed is that of providing a method and an apparatus for determining a chamfer property of a workpiece chamfer and also a program that allows an accurate and reliable determination of the chamfer property.

The technical problem is resolved by a method and an apparatus for determining a chamfer property of a workpiece chamfer as described herein.

Exemplary chamfer properties have already been explained above. It goes without saying that still further chamfer properties, different from the properties discussed, can however be determined by the proposed method.

In a first step, which may also be referred to as the measuring step, measurement points are generated along at least one measuring path or trajectory, the first measuring path running over a first chamfer edge. The first measuring path may in particular be of a predetermined length. A chamfer edge refers here to the line of intersection of two surfaces, one of the surfaces being a chamfer surface. The other surface may be in particular a further surface of the workpiece, for example a cylindrical outer surface, a side surface or a bottom surface of the workpiece. The measurement points are in this case generated along the surface of the workpiece. In particular, coordinates of the measurement points therefore represent coordinates of surface points of the workpiece.

A spatial course of the first measuring path may in this case be determined depending on previously known properties, in particular a previously known spatial position, of the workpiece and/or the chamfer. This may take place in a workpiece coordinate system. The previously known property may in this case be an estimated, in particular calculated, furthermore in particular a non-measured, property of the workpiece. For example, the predetermined property may be determined depending on structural information, for example structural data, of the workpiece. The predetermined spatial position may also be determined depending on an already determined or previously known spatial position of the workpiece in a coordinate system of a measuring device, the measuring device generating the measurement points. For this, it may be necessary to carry out a coordinate transformation between the workpiece coordinate system and the measuring device coordinate system (machine coordinate system). This transformation may in this case be determined in a registration step.

In particular, a starting point of the first measuring path and an end point of the first measuring path may be chosen such that the first measuring path runs over the first chamfer edge.

The measuring device for generating the measurement points may be in particular a so-called coordinate measuring device, which may also be referred to as a coordinate measuring machine. The measuring device may include a tactile sensor for generating the measurement points or an optical sensor for generating the measurement points. Corresponding measuring devices and sensors are in this case known to a person of ordinary skill in the art from the related art.

That the first measuring path runs over a chamfer edge may mean in particular that the first measuring path does not run parallel to the chamfer edge. Typically, an angle between the first measuring path and the first chamfer edge is 90°. However, it is also conceivable that the angle between the chamfer edge and the measuring path lies in a range from 0 (exclusive) to 180° (exclusive), typically in a range from 45° (inclusive) to 135° (inclusive). A property, in particular a length and/or a position and/or a course of the first measuring path, may be chosen in this case such that the first measuring path runs over the first chamfer edge, but not over a further chamfer edge.

According to an aspect of the disclosure, in a compensating-determining step, at least one unadapted compensating element is determined for the measurement points of the first measuring path. As will be explained in more detail below, the compensating element may be in particular a straight compensating line. However, other geometrical configurations of the compensating element are also conceivable, for example a circle or an ellipse.

An unadapted compensating element may refer in particular to an element of which the geometrical shape is chosen such that a minimal deviation other than zero between the measurement points generated without errors and the unadapted compensating element exists when properties or parameters of the compensating element have been optimized in such a way that the deviation between the compensating element and the measurement points generated without errors is minimal. The geometrical shape refers in particular to the shape as a straight line, the shape of a circle, the shape of an ellipse or a further geometrical shape.

Thus, an unadapted compensating element may be a compensating element that has a deviation other than zero from an intended course of the first measuring path when parameters of the compensating element have been chosen such that this deviation has been minimized. The intended course of the first measuring path may for example be determined from structural data of the workpiece, in particular CAD data.

In particular, the unadapted compensating element must not follow a sharply angled course, and consequently cannot comprise or consist of two straight sub-portions that are angled away in relation to one another.

The unadapted compensating element, in particular properties of the unadapted compensating element such as its spatial position and/or its spatial course, may be determined in such a way that it approximates the measurement points of the first measuring path as optimally as possible. In other words, the compensating element may be determined in such a way that the distance or distances between the measurement points and the compensating element is/are minimized. The determination of a corresponding amount of distance may take place with various suitable cost functions. A cost function may be for example the sum of the distances or the squared distances of the measurement points from the compensating element. Distances may be measured along a joining line, oriented perpendicularly to the compensating element, between the measurement point and the compensating element or along a joining line, oriented perpendicularly to a tangential direction of the compensating element at the point of intersection with the joining line. In still other words, a best-fitting unadapted compensating element can therefore be determined.

The unadapted compensating element may in this case be of a predetermined length.

Furthermore, the at least one property may be determined in such a way that the amount of distance/amounts of distance is/are minimized, in particular by a suitable optimizing method, for example by the method of least squares (least-squares method). It goes without saying, however, that the use of other cost functions and optimizing methods for determining the compensating element is possible.

The measurement points and the compensating element may be determined in the machine coordinate system or the workpiece coordinate system.

Furthermore, the spatial position of the first chamfer edge is determined depending on a deviation between the measurement points of the first measuring path and the compensating element determined in such a way. This may mean in particular that the numerical values of the deviation are quantitatively evaluated for determining the spatial position. Also, a course of the deviation may be determined along the measuring path or along the compensating element, that is to say for example for each measurement point, the spatial position of the first chamfer edge then being determined depending on this course.

Consequently, the spatial position of the first chamfer edge may therefore be determined as the chamfer property.

It is possible that, in addition to the deviation, the position of the measurement points in relation to the compensating element is also taken into account in the determination of the spatial position of the first chamfer edge, in particular whether a measurement point lies in the first spatial half delimited by the compensating element, in which also the intended position of the chamfer edge or lies in the half lying opposite this first spatial half.

As a result, an easy to implement, reliable and accurate determination of the spatial position of the first chamfer edge is advantageously obtained. In particular, it is not necessary to carry out a complicated determination and movement along the first measuring path in order to determine the spatial position of the first chamfer edge.

In summary, a compensating element that is not adapted in its geometrical shape to the intended course of the first measuring path is thus chosen, though its properties, in particular its spatial position, is/are then chosen such that it approximates as well as possible to the course of the measurement points along the first measuring path (best fit). Thereafter, the distance of the measurement points from the compensating element determined in such a way is then evaluated and used to determine the position of the chamfer edge. In this case, the geometrical shape of the compensating element is not fixed, but the compensating element or its geometrical shape should be chosen such that a distance between the compensating element and the measurement points can be determined.

It is also possible that, in the first step, measurement points are generated along a measuring path or trajectory, this measuring path running both over the first chamfer edge and over a further chamfer edge. Furthermore, an unadapted compensating element can then be determined for the measurement points of this measuring path, the spatial position of the first chamfer edge and the spatial position of the further chamfer edge being determined depending on a deviation between the measurement points of this measuring path and the compensating element. In other words, the spatial positions of the first chamfer edge and the further chamfer edge can therefore be determined depending on the measurement points that were generated along the measuring path and their deviation from the unadapted compensating element. The determination may take place by suitable calculation methods, it also being necessary in particular for tolerances to be taken into account. For example, the positions of the two measurement points that have the greatest deviations from the compensating element may be determined as spatial positions of the first chamfer edge and the further chamfer edge.

It is also possible to divide the measuring path into at least two path regions. A property of a path region, for example a position and/or a length and/or a course, may in this case be predetermined. It may also be possible for a property to be set manually, for example by a user, or automatically, for example by a corresponding evaluation method.

Furthermore, the spatial position of the first chamfer edge may be determined depending on a deviation between the measurement points of a first path region and the compensating element. Likewise, the spatial position of the further chamfer edge may be determined depending on a deviation between the measurement points of a further path region and the compensating element. In this case, the property/properties of the path regions is/are determined in particular in such a way that in the first path region the measuring path runs over the first chamfer edge and in the further path region it runs over the further chamfer edge. Typically, the property/properties of the path regions is/are determined in such a way that in the first path region the measuring path does not run over the further chamfer edge and in the further path region it does not run over the first chamfer edge.

It is also possible that a first unadapted compensating element is determined for the measurement points of a first path region, the spatial position of the first chamfer edge being determined depending on a deviation between the measurement points of this first path region and the first compensating element. Similarly, a further unadapted compensating element may be determined for the measurement points of a further path region, the spatial position of the further chamfer edge being determined depending on a deviation between the measurement points of this further path region and the further compensating element.

In a further exemplary embodiment, the compensating element is a straight line. This has already been explained above. Properties of such a compensating element may be in particular a interpolation point, a slope, and an orientation of the straight line.

If the first measuring path runs over the first chamfer edge, the measuring path will have a sharply angled or curved course. Choosing the compensating element as a straight line consequently means choosing a geometrical shape of the compensating element that is unadapted to the actual course of the measuring path. The compensating element is in this case therefore chosen such that it is not adapted to the intended course of the measuring path, that is to say a course of the measurement points, when they are recorded without errors, i.e., in an ideal measurement.

In the case of a straight line, consequently, at least some of the measurement points of the first measuring path are arranged at a distance from the compensating element. It can in this case be assumed that measurement points that were generated in the region of the edge, that is to say at or on the edge, are at a further distance from the compensating element formed as a straight line than measurement points that were generated further away from the edge. Consequently, the spatial position of the chamfer edge may be determined depending on the spatial position of the measurement points that are at the greatest distance from the compensating element. However, it is not imperative that, as still to be explained in more detail below, the measurement point at the greatest distance from the compensating element necessarily fixes the spatial position of the edge.

For example, it is conceivable that a mid-point of all the measurement points, or their coordinates, of which the distance from the compensating element is greater than 80%, 90%, or 95% of the maximum distance is determined as the spatial position of the chamfer edge. Also, the spatial position of the chamfer edge may be determined depending on coordinates of the measurement points weighted with an amount of distance, the measurement point coordinates that are used for determining the spatial position being weighted all the more the greater the distance of the corresponding measurement point from the compensating element is.

However, in this case these measurement points can only be taken into account if they lie in the previously explained first spatial half.

This advantageously provides an easy to implement and—as previously explained—reliable and accurate determination of the spatial position of the first chamfer edge, in particular since a compensating element formed as a straight line, or its properties, can be easily and reliably determined.

In a further exemplary embodiment, a distance between the measurement point and the compensating element is respectively determined for each of the measurement points, the spatial position of the measurement point at the maximum distance from the compensating element being determined as the spatial position of the chamfer edge. This advantageously produces a determination of the spatial position of the chamfer edge that can be implemented in quick time and with little computational effort.

In a further exemplary embodiment, a length of the first measuring path is determined depending on a positional tolerance of the intended spatial position of the first chamfer edge. Alternatively or in addition, a length of the first measuring path is determined depending on an intended width of the chamfer.

For example, the length of the first measuring path may be determined in such a way that it corresponds to the positional tolerance of the intended spatial position or is longer than this positional tolerance by a predetermined percentage, for example by 10% or 20%.

Also, the length of the first measuring path may be determined in such a way that it corresponds to the intended width or is longer than this intended width by a predetermined percentage, for example by 10% or 20%.

Also, the length of the first measuring path may be determined in such a way that it corresponds to the sum of the positional tolerance and intended width or is longer than this amount by a predetermined percentage, for example by 10% or 20%.

Also, the length of the first measuring path may be determined in such a way that it is not longer than a predetermined multiple of the positional tolerance or the intended width or the sum of the positional tolerance and the intended width, for example not longer than 1.5 times this amount.

This advantageously produces an improvement of the reliability of the determination of the spatial position, since, by choosing the length, it can be ensured with a greater probability that the measuring path runs over the first chamfer edge.

In a further exemplary embodiment, measurement points are generated along a further measuring path, the further measuring path running over a further chamfer edge, a further unadapted compensating element being determined for the measurement points of the further measuring path. Furthermore, the spatial position of the further chamfer edge is determined depending on a deviation between the measurement points of the further measuring path and the further compensating element. The previously explained aspects for determining the spatial position of the first chamfer edge depending on a deviation between the measurement points of the first measuring path and the compensating element also apply here in a corresponding way to the determination of the spatial position of the further chamfers.

Typically, the first measuring path and the further measuring path lie in a common measuring plane, it being possible for a normal vector of the measuring plane to be oriented perpendicularly to the normal vector of the chamfer surface. Also, the measuring plane may be oriented perpendicularly to the first and/or further chamfer edge, in particular to the intended course of the chamfer edge(s).

The further measuring path may in this case continue the course of the first measuring path, in particular have the same orientation. However, it is also possible that the first and the further measuring path intersect at an angle that is different from 0° or 180°, and consequently have different orientations.

A property, in particular a length and/or a position and/or a course of the first measuring path, may be chosen in this case such that the further measuring path runs over the further chamfer edge, but not over the first chamfer edge.

In a further exemplary embodiment, the method is a computer-implemented method. This is still to be explained in more detail below.

Also provided is a program which, when it is run on or by a computer, causes the computer or the computing device or the apparatus for data processing to carry out one, several or all of the steps of the method set out in this disclosure for determining a chamfer property of a workpiece chamfer.

A computer may in this case be any kind of data processing device, in particular however one of the previously explained computing device or an apparatus for data processing, in particular a programmable computing device or apparatus for data processing.

Alternatively or in addition, a program storage medium or computer program product, on or in which the program is stored, in particular in a non-temporary, i.e., permanent, form, is described. Alternatively or in addition, a computer which includes this program storage medium is described. Moreover, alternatively or in addition, a signal is described, for example a digital signal, which codes information items representing the program and which includes coding means suitable for performing one, several or all of the steps of the method set out in this disclosure for determining a chamfer property of a workpiece chamfer. The signal may be a physical signal, for example an electrical signal, which in particular is generated technically or by machine.

Moreover, the method for determining a chamfer property of a workpiece chamfer may be a computer-implemented method. For example, one, several, or all of the steps of the method may be performed by a computer. One exemplary embodiment of the computer-implemented method is the use of the computer for carrying out a data processing method. The computer may for example include at least one computing device, in particular a processor, and for example at least one storage device, in order to process the data, in particular technically, for example electronically and/or optically. A processor may be a semiconductor-based processor.

Also described is a computer program or a computer program product, including commands which, when the program is run by a computer, cause it to carry out one, several or all of the steps of the method set out in this disclosure for determining a chamfer property of a workpiece chamfer. Also described is a non-transitory computer-readable (storage) medium, including such commands. In addition, described is a computer-readable data carrier, on which the computer program (product) is stored.

Also provided is an apparatus for determining a chamfer property of a workpiece chamfer, the apparatus including an input interface for receiving measurement points, in particular the measurement points generated along the at least first measuring path, and at least one evaluation device. The evaluation device may be formed as a computing device and an apparatus for data processing. In particular, the evaluation device may be formed as a microcontroller or integrated circuit, for example as a field programmable gate array (FPGA), or may include a microcontroller or integrated circuit.

According to an aspect of the disclosure, with the evaluation device, an unadapted compensating element can be determined for the measurement points of the first measuring path and the spatial position of the first chamfer edge depending on a deviation between the measurement points of the first measuring path and the compensating element. The evaluation device may be formed or configured here in particular in such a way that the determination explained is possible by means of the evaluation device.

The apparatus according to an aspect of the disclosure serves in an advantageous way for carrying out a method described in this disclosure. In particular, the apparatus may consequently be configured or formed in such a way that a method according to one of the exemplary embodiments described in this disclosure can be carried out with the apparatus.

Also described is an apparatus for data processing, including means for carrying out the steps of a method for determining a chamfer property of a workpiece chamfer according to an exemplary embodiment of the disclosure.

Also described is a coordinate measuring machine, the coordinate measuring machine including an apparatus for determining a chamfer property of a workpiece chamfer and/or an apparatus for data processing according to one of the exemplary embodiments of the disclosure. In particular, with the coordinate measuring machine measurement points can be generated along the measuring paths explained.

BRIEF DESCRIPTION OF THE DRAWINGS

The disclosure will now be described with reference to the drawings wherein.

DESCRIPTION OF EXEMPLARY EMBODIMENTS

Identical reference signs hereinafter designate elements having identical or similar technical features.

Figure 1:
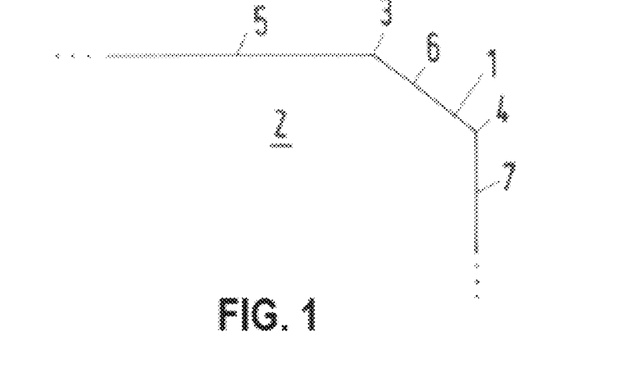
FIG. 1 shows a schematic side view of a chamfer of a workpiece.

FIG. 1 shows a schematic side view of a chamfer 1 of a workpiece 2. The chamfer 1 has a first chamfer edge 3 and a further chamfer edge 4. The first chamfer edge 3 is formed as a line of intersection of a first surface 5 of the workpiece 2 and the chamfer surface 6. The second chamfer edge 4 is formed as a line of intersection between the chamfer surface 6 and a further surface 7 of the workpiece, the further surface 7 being different from the first surface 5, in particular having a normal vector that is different from the normal vector of the first surface 5.

The surfaces 5, 6, and 7 may be in particular uncurved, that is to say planar, surfaces.

Figure 2:
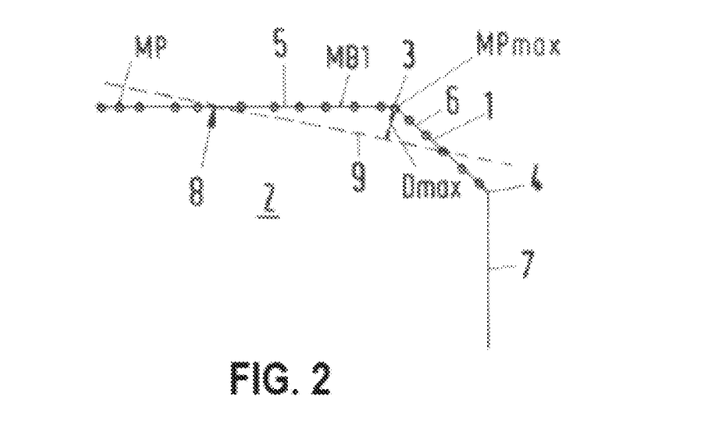
FIG. 2 shows a schematic view of a first measuring path and a first unadapted compensating element.

FIG. 2 shows a schematic view of a workpiece 2 of the chamfer 1, the first surface 5, the chamfer surface 6 and the first chamfer edge 3. Also shown are measurement points MP that were generated along a first measuring path MB1. The first measuring path MB1 in this case runs along the first surface 5 over the first chamfer edge 3 and along the chamfer surface 6 up to the second chamfer edge 4. The direction of the first measuring path MB1 is symbolically represented by an arrow 8. For the sake of overall clarity, only one of the measurement points MP is provided with a reference sign.

In FIG. 2, it is shown that the measurement points MP are measurement points recorded without errors, coordinates of the measurement points corresponding to the actual coordinates of points on the first surface 5 or the chamfer surface. In reality, because of measuring errors, not every measurement point MP can code the exact spatial position of a point on the first surface 5 or on the chamfer surface 6 but may code coordinates deviating slightly therefrom.

It is also evident that the course of the first measuring path B1 with the measurement points MP recorded without errors is a sharply angled course, the sharp angle being arranged at the location of the first chamfer edge 3.

Also shown is a first unadapted compensating element 9, which is symbolized by a dashed line. The first compensating element 9 is formed as a straight line, and is consequently not adapted to the sharply angled course of the first measuring path MB1 formed by the measurement points MP recorded without errors.

Properties or parameters of this first unadapted compensating element 9, in particular a spatial position and a course or these coding parameters, are in this case chosen such that the deviation between measurement points MP of the first measuring path MB1 and the compensating element 9 is minimal. The deviation may be represented by a cost function, the properties/parameters of the first compensating element 9 being determined in such a way, for example by a suitable optimizing method, that this cost function is minimal.

The spatial position may in this case refer to a position and/or orientation in a coordinate system, in particular a reference coordinate system. The reference coordinate system may be in particular a coordinate system of the measuring device or a workpiece coordinate system.

For each of the measurement points MP, a distance between the respective measurement point MP and the first compensating element 9 can then be respectively determined. For the sake of overall clarity, only the maximum distance Dmax between a maximum-distance-specific measurement point MPmax and the first unadapted compensating element 9 is represented here.

The spatial position of this maximum-distance-specific measurement point MPmax, that is to say of the measurement point MP at the maximum distance Dmax from the first compensating element 9, may then be determined as the spatial position of the first chamfer edge 3. Distance amounts that are known to a person skilled in the art may be chosen here for determining the distance between a point and a straight line, in particular the length of a joining line between the straight line and the measurement point MP, the joining line being oriented perpendicularly to the straight line.

Figure 3:
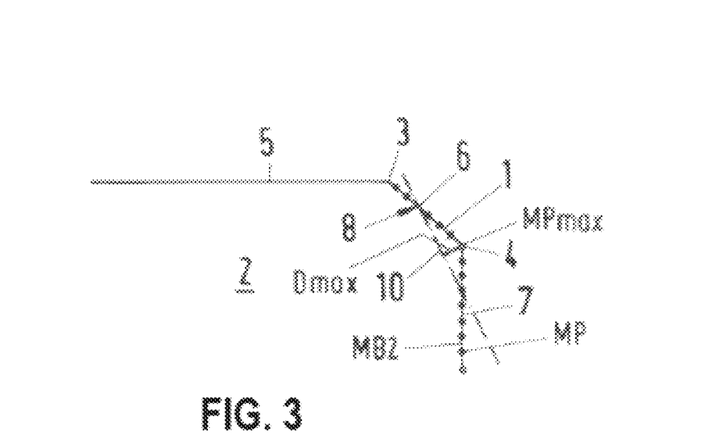
FIG. 3 shows a schematic view of a further measuring path and a further unadapted compensating element.

FIG. 2 shows a schematic view of a workpiece 2 of the chamfer 1, the further surface 7, the chamfer surface 6 and the further chamfer edge 4. Also shown are measurement points MP that were generated along a further measuring path MB2. The further measuring path MB2 in this case runs along the further surface 7 over the further chamfer edge 4 and along the chamfer surface 6 up to the first chamfer edge 3. A direction of the further measuring path MB2 is symbolically represented by an arrow 8. For the sake of overall clarity, only one of the measurement points MP is provided with a reference sign.

The further measuring path MB2 may be chosen in this case in particular such that it runs over the further chamfer edge 4, but not over the first chamfer edge 3.

In FIG. 3 it is shown that the measurement points MP are measurement points recorded without errors, coordinates of the measurement points corresponding to the actual coordinates of points on the further surface 7 or the chamfer surface 6. In reality, because of measuring errors, not every measurement point MP can code the exact spatial position of a point on the further surface 7 or on the chamfer surface 6, but may code coordinates deviating slightly therefrom.

It is also evident that the course of the further measuring path MB2 with the measurement points MP recorded without errors is also a sharply angled course, the sharp angle being arranged at the location of the further chamfer edge 4.

Also shown is a further unadapted compensating element 10, which is symbolized by a dashed line. The further compensating element 10 is likewise formed as a straight line, and is consequently not adapted to the sharply angled course of the further measuring path MB2 formed by the measurement points MP recorded without errors.

Similarly to in the case of the first unadapted compensating element 9, the properties or parameters of this further unadapted compensating element 10 are chosen such that the deviation between measurement points MP of the further measuring path MB2 and the compensating element 10 is minimal. With respect to the determination of this property, reference can be made to the explanations on determining the properties/parameters of the first unadapted compensating element 9.

For each of the measurement points MP, a distance between the respective measurement point MP and the further compensating element 10 can then be respectively determined. For the sake of overall clarity, only the maximum distance Dmax between a maximum-distance-specific measurement point MPmax and the further unadapted compensating element 10 is represented here.

The spatial position of this maximum-distance-specific measurement point MPmax, that is to say of the measurement point MP at the maximum distance Dmax from the further compensating element 10, may then be determined as the spatial position of the further chamfer edge 3.

Furthermore, the chamfer width can then be determined depending on the spatial positions of the maximum-distance-specific measurement points MPmax that were generated along the first measuring path MB1 and the further measuring path MB2, for example as the distance between these measurement points MPmax, in particular when the first and the further measuring path MB1 and MB2 lie in a plane that is oriented perpendicularly to the chamfer edges 3 and 4 or the normal vector of which lies in a plane defined by the chamfer surface 6.

Figure 4:
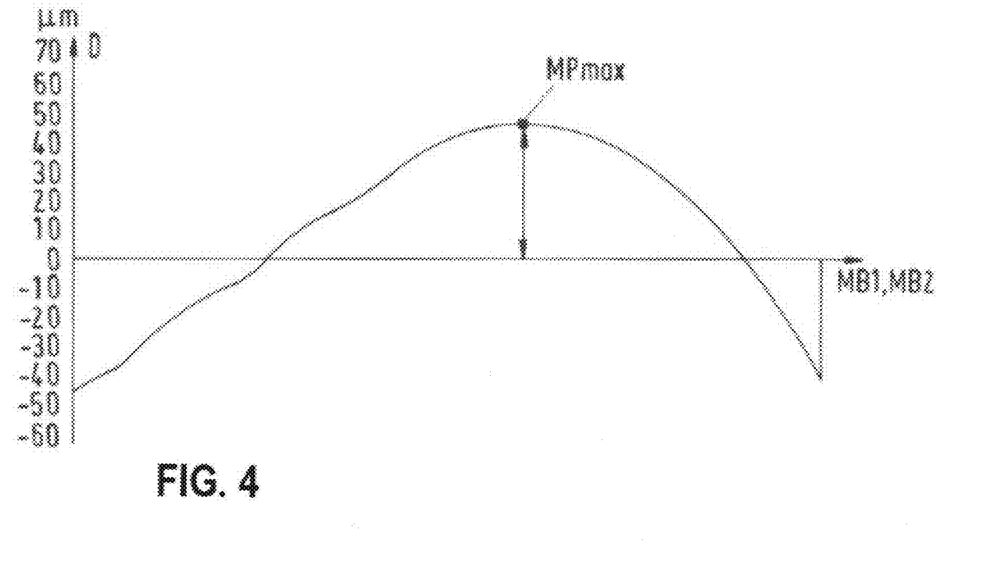
FIG. 4 shows a schematic representation of deviations between measurement points and a compensating element.

FIG. 4 shows by way of example a course of the distances D of measurement points along a measuring path MB1 and MB2 from the correspondingly determined, unadapted compensating element 9 and 10 (see FIG. 2 and FIG. 3). The distances D are shown here as positive or negative.

It is evident that the course of the line representing the distances has a curved shape, which may depend in particular on the diameter of a probing ball that is used.

Depending on the spatial positions of the chamfer edge 3 and 4, it is then also possible—as explained—for a width of the chamfer 1 to be determined. A chamfer angle, that is to say an angle between the first surface 5 and the chamfer surface 6 or an angle between the chamfer surface 6 and the further surface 7 of the workpiece 2, may also be determined depending on the spatial positions of the two chamfer edges 3 and 4.

Tests have shown that the measuring accuracies achieved with the method according to an aspect of the disclosure are very high. It has also been possible to show that a chamfer property, in particular a width of the chamfer 1, can be determined with a desired reproducibility. For instance, it has been possible to establish that measurement results obtained when measuring a chamfer only vary in the range between 3 micrometers and 8 micrometers.

The method can be advantageously applied here to various workpieces and chamfer widths, and consequently can be flexibly used.

Figure 5:
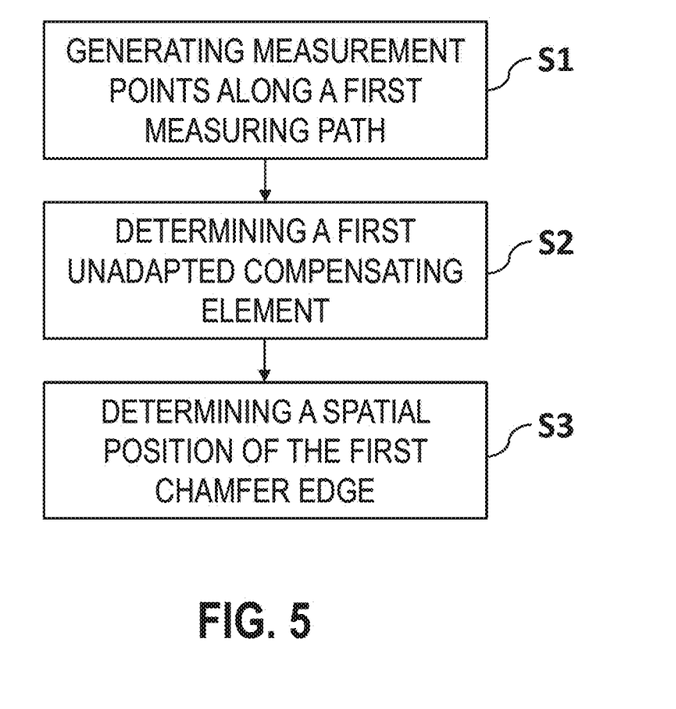
FIG. 5 shows a schematic flow diagram of a method according to a first exemplary embodiment of the disclosure.

In FIG. 5, a schematic flow diagram of a method according to a first embodiment of the disclosure is shown. In a first step S1, measurement points MP are generated along a first measuring path MB1, the first measuring path MB1 running over a first chamfer edge 3 (see FIG. 2).

In a second step S2, a first unadapted compensating element 9 is determined for the measurement points MP of the first measuring path MB1. This has been explained above. In a third step S3, the spatial position of the first chamfer edge 3 is then determined depending on the deviation between the measurement points MP of the first measuring path MB1 and the compensating element 9.

Figure 6:
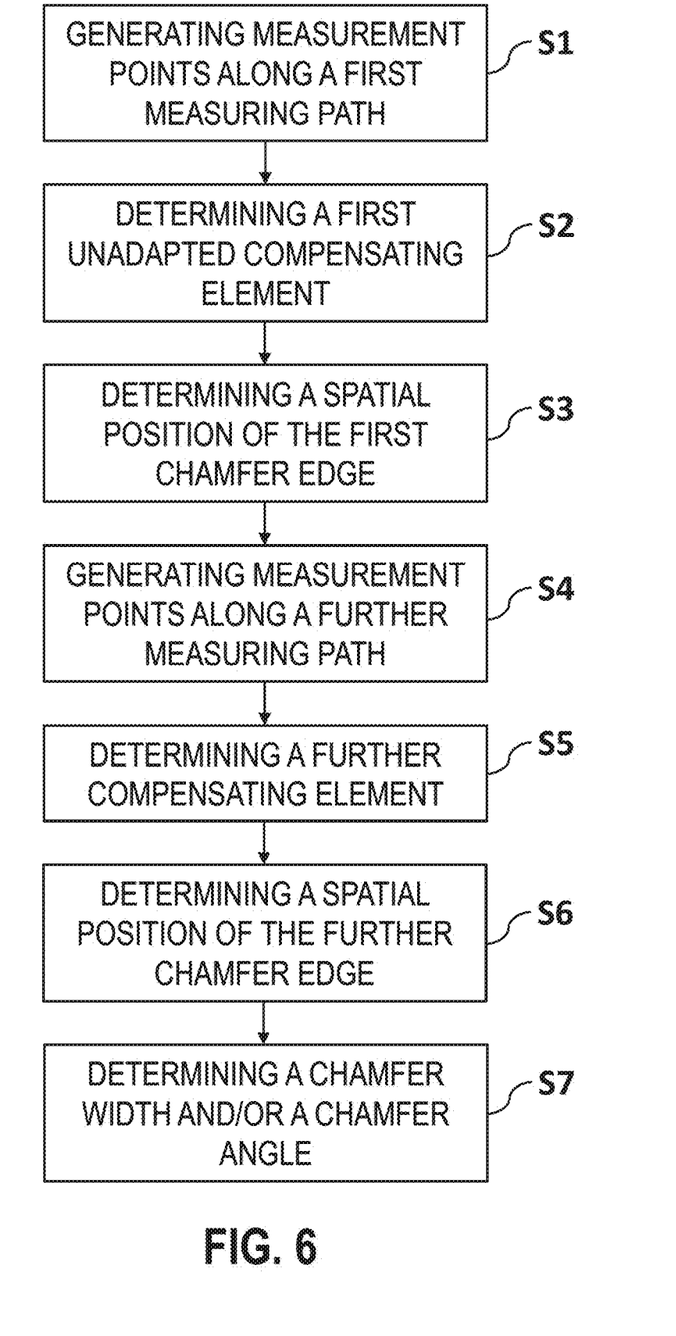
FIG. 6 shows a schematic flow diagram of a method according to a further exemplary embodiment the disclosure.

FIG. 6 shows a schematic flow diagram of a method according to a further exemplary embodiment of the disclosure. Here, a first, a second, and a third step S1, S2, and S3 correspond to the steps S1, S2, and S3 shown in FIG. 5. In a fourth step S4, measurement points MP are generated along a further measuring path MB2, the further measuring path MB2 running over a further chamfer edge 4. Furthermore, in a fifth step S5, a further compensating element 10 is determined for the measurement points MP of the further measuring path MB2. Furthermore, in a sixth step S6, the spatial position of the further chamfer edge 4 is determined depending on a deviation between the measurement points MP of the further measuring path MB2 and the further compensating element 10. In a seventh step S7, a chamfer width and/or a chamfer angle may then be determined depending on the spatial positions of the first chamfer edge 3 and the spatial position of the further chamfer edge 4 for example as a chamfer property.

Figure 7:
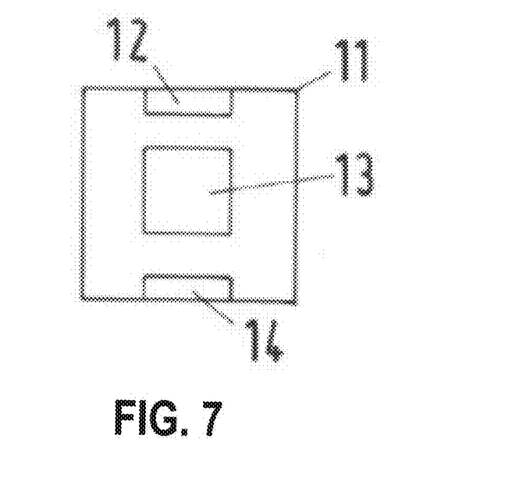
FIG. 7 shows a schematic block diagram of an apparatus according to an exemplary embodiment the disclosure.

FIG. 7 shows a schematic block diagram of an apparatus 11 according to an aspect of the disclosure for determining a chamfer property of a workpiece chamfer 1. The apparatus 11 includes an input interface 12 for receiving measurement points MP. The apparatus 11 also includes an evaluation device 13, which may be formed as an apparatus for data processing, in particular as a computing device.

The apparatus 11 also includes an output interface 14 for outputting a chamfer property or information coding on the basis of the chamfer property.

With the evaluation device 13, the second step S2, the third step S3, the fifth step S5, and the sixth step S6, shown in FIG. 5 and in FIG. 6, and the seventh step S7 (see FIG. 6) can be carried out in particular.

It is understood that the foregoing description is that of the exemplary embodiments of the disclosure and that various changes and modifications may be made thereto without departing from the spirit and scope of the disclosure as defined in the appended claims.

LIST OF REFERENCE NUMERALS

1 Chamfer
2 Workpiece
3 First chamfer edge
4 Further chamfer edge
5 First surface of the workpiece
6 Chamfer surface
7 Further surface of the workpiece
8 Arrow
9 First unadapted compensating element
10 Further unadapted compensating element
11 Apparatus
12 Input interface
13 Evaluation device
14 Output interface
MB1 First measuring path
MB2 Further measuring path
MP Measurement point
MPmax Maximum-distance-specific measurement point
D Distance
Dmax Maximum distance

What is claimed is:

1. A method for determining a chamfer property of a workpiece chamfer, the method comprising:
generating measurement points along at least a first measuring path by a coordinate measuring machine, the first measuring path having a first geometrical shape and running over a first chamfer edge;
determining at least one unadapted compensating element for the measurement points of the first measuring path by an evaluation device, wherein the unadapted compensating element has a second geometrical shape, and wherein the first geometrical shape deviates from the second geometrical shape; and
determining a spatial position of the first chamfer edge depending on a deviation between the measurement points of the first measuring path and at least one corresponding point of the at least one unadapted compensating element, wherein the measurement points of the first measuring path result from a measurement performed by the coordinate measuring machine.

2. The method as claimed in claim 1, wherein the at least one unadapted compensating element is a straight line.

3. The method as claimed in claim 1, further comprising:
respectively determining a distance between a measurement point and the least one unadapted compensating element for each of the measurement points; and
determining the spatial position of the measurement point at a maximum distance from the least one unadapted compensating element as the spatial position of the first chamfer edge.

4. The method as claimed in claim 1, further comprising:
determining a length of the first measuring path depending on at least one of a positional tolerance of an intended spatial position of the first chamfer edge and an intended width of the workpiece chamfer.

5. The method as claimed in claim 1, further comprising:
generating measurement points along a further measuring path, the further measuring path running over a further chamfer edge;
determining a further compensating element for the measurement points of the further measuring path; and
determining the spatial position of the further chamfer edge depending on the deviation between the measurement points of the further measuring path and the further compensating element.

6. The method as claimed in claim 5, further comprising:
determining at least one of a chamfer width and a chamfer angle depending on the spatial position of the first chamfer edge and the spatial position of the further chamfer edge.

7. The method as claimed in claim 1, wherein the method is a computer-implemented method.

8. A non-transitory computer-readable storage medium on which a computer program is stored which, when executed by a computer, causes the computer to:
determine at least one unadapted compensating element for measurement points of a first measuring path by an evaluation device, wherein the first measuring path has a first geometrical shape, wherein the unadapted compensating element has a second geometrical shape, and wherein the first geometrical shape deviates from the second geometrical shape; and determine a spatial position of the first chamfer edge depending on a deviation between the measurement points of the first measuring path and at least one corresponding point of the at least one unadapted compensating element, wherein the measurement points of the first measuring path result from a measurement performed by a coordinate measuring machine.

9. An apparatus for determining a chamfer property of a workpiece chamfer, the apparatus comprising:
an input interface configured to receive measurement points generated by a coordinate measuring machine; and
at least one evaluation device configured to determine at least one unadapted compensating element for the measurement points of a first measuring path and a spatial position of a first chamfer edge depending on a deviation between the measurement points of the first measuring path and corresponding points of the at least one unadapted compensating element,
wherein the first measuring path has a first geometrical shape,
wherein the unadapted compensating element has a second geometrical shape,
wherein the first geometrical shape deviates from the second geometrical shape, and
wherein the measurement points of the first measuring path result from a measurement performed by the coordinate measuring machine.

10. The method as claimed in claim 3, wherein the distance is measured:
along a joining line, oriented perpendicularly to the compensating element, between the measurement point and the compensating element, or
along a joining line, oriented perpendicularly to a tangential direction of the compensating element at the point of intersection with the joining line.

* * * * *

UNITED STATES PATENT AND TRADEMARK OFFICE
CERTIFICATE OF CORRECTION

| | | |
|---|---|---|
| PATENT NO. | : 11,713,965 B2 | Page 1 of 1 |
| APPLICATION NO. | : 16/870971 | |
| DATED | : August 1, 2023 | |
| INVENTOR(S) | : Heinrich Mueller and Konrad Werner | |

It is certified that error appears in the above-identified patent and that said Letters Patent is hereby corrected as shown below:

On the Title Page

<u>Item (56), FOREIGN PATENT DOCUMENTS change:</u>
"DE 1325269 A1" to "DE 4325269 A1"

Signed and Sealed this
Thirtieth Day of September, 2025

John A. Squires
*Director of the United States Patent and Trademark Office*